United States Patent
Zhang et al.

(10) Patent No.: US 6,617,612 B2
(45) Date of Patent: *Sep. 9, 2003

(54) SEMICONDUCTOR DEVICE AND A SEMICONDUCTOR INTEGRATED CIRCUIT

(75) Inventors: Hongyong Zhang, Kanagawa (JP); Naoaki Yamaguchi, Kanagawa (JP); Yasuhiko Takemura, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

This patent is subject to a terminal disclaimer.

(21) Appl. No.: 09/769,374

(22) Filed: Jan. 26, 2001

(65) Prior Publication Data

US 2001/0007357 A1 Jul. 12, 2001

Related U.S. Application Data

(62) Division of application No. 08/815,070, filed on Mar. 11, 1997, now Pat. No. 6,218,678, which is a division of application No. 08/334,335, filed on Nov. 2, 1994, now Pat. No. 5,648,277.

(30) Foreign Application Priority Data

Nov. 5, 1993 (JP) .............................. 5-301174
Nov. 5, 1993 (JP) .............................. 5-301176

(51) Int. Cl.[7] ........................ H01L 29/04; H01L 29/76
(52) U.S. Cl. ........................ 257/59; 257/72; 257/344; 257/382; 257/383; 257/408
(58) Field of Search ........................ 257/59, 72, 344, 257/382, 383, 408; 349/42, 43

(56) References Cited

U.S. PATENT DOCUMENTS

3,775,262 A  * 11/1973  Heyerdahl
4,232,327 A  * 11/1980  Hsu (List continued on next page.)

FOREIGN PATENT DOCUMENTS

EP         0 178 447        *  4/1986

(List continued on next page.)

OTHER PUBLICATIONS

Makino, "Application of Polyimide Resin to Semiconductor Devices in Japan," Mar./Apr. 1988, pp. 15–23, IEEE Electrical Insulation Magazine vol. 4. No. 2.*

(List continued on next page.)

Primary Examiner—Minh Loan Tran
(74) Attorney, Agent, or Firm—Eric J. Robinson; Robinson Intellectual Property Law Office, P.C.

(57) ABSTRACT

The present invention relates to a semiconductor device and a semiconductor integrated circuit. The semiconductor device comprises a semiconductor layer comprising a channel region, a source and a drain regions and at least one lower impurity concentration region interposed between the channel region and the source or the drain region. The source and the drain regions comprise metal silicide region. The lower impurity concentration region is not covered with the metal silicide region. The operational speed of the circuit can be improved, and the leak current of the transistor can be reduced.

29 Claims, 8 Drawing Sheets

U.S. PATENT DOCUMENTS

| | | | |
|---|---|---|---|
| 4,727,044 A | * | 2/1988 | Yamazaki |
| 4,728,617 A | * | 3/1988 | Woo et al. |
| 4,956,539 A | * | 9/1990 | Uesugi et al. |
| 5,100,810 A | * | 3/1992 | Yoshimi et al. |
| 5,252,502 A | * | 10/1993 | Havermann |
| 5,292,675 A | * | 3/1994 | Codama |
| 5,308,998 A | * | 5/1994 | Yamazaki et al. |
| 5,313,076 A | | 5/1994 | Yamazaki et al. |
| 5,341,028 A | * | 8/1994 | Yamaguchi et al. |
| 5,508,209 A | | 4/1996 | Zhang |
| 5,576,556 A | * | 11/1996 | Takemura et al. |
| 5,583,369 A | * | 12/1996 | Yamazaki et al. |
| 5,620,905 A | | 4/1997 | Konuma et al. |
| 5,648,277 A | * | 7/1997 | Zhang et al. |
| 5,650,338 A | * | 7/1997 | Yamazaki et al. |
| 5,753,542 A | | 5/1998 | Yamazaki et al. |
| 5,821,563 A | * | 10/1998 | Yamazaki et al. |
| 5,913,112 A | * | 6/1999 | Yamazaki et al. |
| 5,962,869 A | | 10/1999 | Yamazaki et al. |
| 5,962,870 A | * | 10/1999 | Yamazaki et al. |
| 5,962,872 A | | 10/1999 | Zhang et al. |
| 6,049,092 A | | 4/2000 | Konuma et al. |
| 6,087,277 A | * | 7/2000 | Shih et al. |
| 6,218,678 B1 | * | 4/2001 | Zhang et al. ............... 257/72 |

FOREIGN PATENT DOCUMENTS

| | | | |
|---|---|---|---|
| JP | 54-070762 | * | 6/1979 |
| JP | 56-146231 | * | 11/1981 |
| JP | 57-094482 | | 6/1982 |
| JP | 57-193291 | | 11/1982 |
| JP | 58-092213 | * | 6/1983 |
| JP | 60-055665 | * | 3/1985 |
| JP | 60-224272 | * | 11/1985 |
| JP | 61-224360 | * | 10/1986 |
| JP | 62-039068 | * | 2/1987 |
| JP | 63-223788 | * | 9/1988 |
| JP | 64-045162 | * | 2/1989 |
| JP | 01-192173 | * | 8/1989 |
| JP | 01-241862 | | 9/1989 |
| JP | 02-084770 | * | 3/1990 |
| JP | 02-159730 | * | 6/1990 |
| JP | 02-228041 | | 9/1990 |
| JP | 03-009529 | * | 1/1991 |
| JP | 03-062971 | | 3/1991 |
| JP | 03-165575 | | 7/1991 |
| JP | 04-147629 | * | 5/1992 |
| JP | 05-021801 | * | 1/1993 |
| JP | 05-074702 | * | 3/1993 |
| JP | 05-114724 | * | 5/1993 |
| JP | 05-142577 | * | 6/1993 |
| JP | 05-275448 | * | 10/1993 |
| JP | 6-013397 | * | 1/1994 |
| JP | 60-224275 | * | 11/1995 |
| JP | 60-245124 | | 12/1995 |
| JP | 2759415 | | 5/1998 |

OTHER PUBLICATIONS

Specifications and Drawings for application Ser. No. 09/409,899, "Laser Processing Apparatus and Laser Processing Process", Filed Oct. 1, 1999, pp. 1–30, 9 pages of drawings, Inventor: Hideto Ohnuma et al.

Specifications and Drawings for Related application Ser. No. 09/409,662, "Method of Fabricating a MIS Transistor", Files Sep. 30, 1999, pp. 1–29, 9 pages of drawings, Inventor: Sunpei Yamazaki.

Specifications and Drawings for the New Divisional application Based on Ser. No. 08/815,070, "A Semiconductor Device and a Manufacturing Method Thereof", filed Feb. 9, 2001, pp. 1–37, 8 pages of drawings, Inventor: Hongyong Zhang et al.

* cited by examiner

SEMICONDUCTOR DEVICE AND A SEMICONDUCTOR INTEGRATED CIRCUIT

This is a division of application Ser. No 08/815,070, filed Mar. 11, 1997, now U.S. Pat. No. 6,218,678, which is a divisional of application Ser. No. 08/334,335, filed Nov. 2, 1994, now U.S. Pat. No. 5,648,277.

BACKGROUND OF THE INVENTION

FIELD OF THE INVENTION

The present invention relates to a semiconductor device and a manufacturing method thereof, in particular, to an insulated gate field effect transistor of a thin film type formed on an insulating surface which may be a surface of an insulating substrate such as glass or an insulating film such as silicon oxide formed on a silicon wafer. Specifically, the present invention is applicable to a manufacture of a TFT (thin film transistor) formed on a glass substrate of which glass distortion temperature is 750° C. or lower. The present invention further relates to a semiconductor integrated circuit which utilizes TFTs on an insulating surface which are formed through a process at a process temperature 650° C. or lower. The semiconductor integrate circuit of the present invention is suitable as an active matrix of a liquid crystal display, a driving circuit of an image sensor, three dimensional integrated circuit, or SOI integrated circuit or a conventional semiconductor integrated circuit such as microprocessor, microcomputer, micro-controller, or semiconductor memory etc. In particular, the present invention is advantageous for a monolithic type active matrix device in which an active matrix circuit and a peripheral driving circuit are formed on a substrate.

Recently, formations of insulated gate field effect semiconductor devices (MOSFET) on insulating substrates have been well studied. The formation of a semiconductor integrated circuit on an insulating substrate is advantageous for improving the operational speed of the circuit because there is no stray capacitor between the insulating substrate and wirings thereon while it exists in the case of a conventional semiconductor integrated circuit which employs a semiconductor substrate. The MOSFET which is formed on an insulating substrate and has an active region in a thin film form is called a thin film transistor (TFT).

Figure 7:
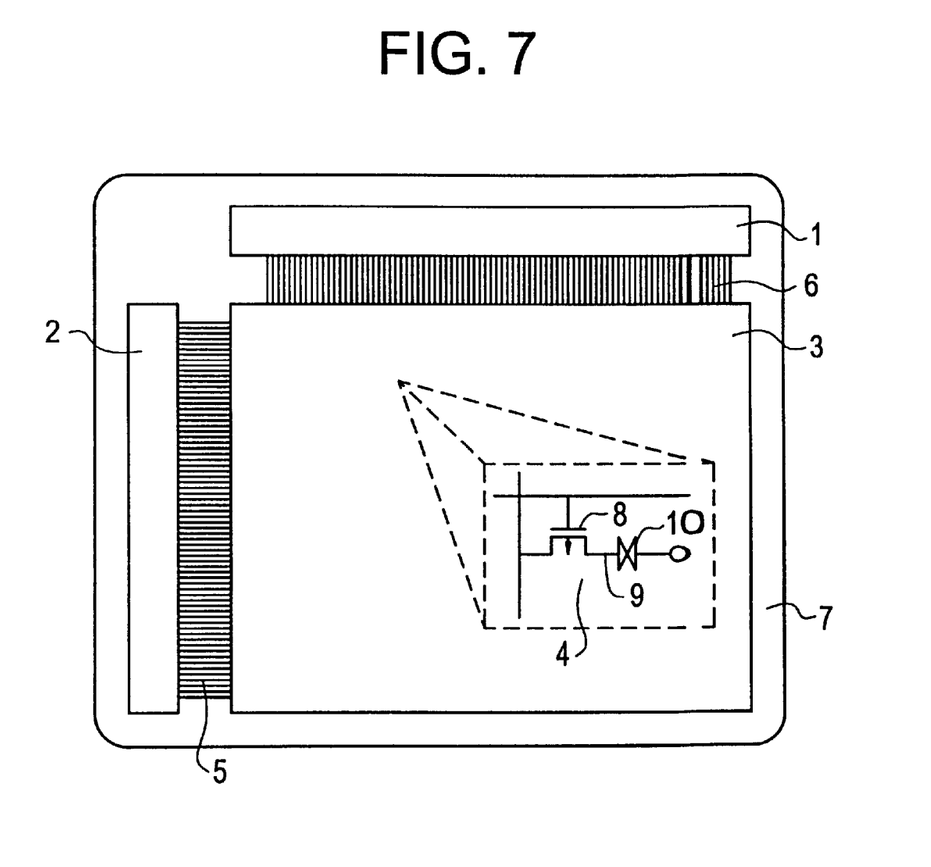
FIG. 7 is a block diagram showing an example of a monolithic integrated circuit formed on substrate.

Also, there is known a device in which a semiconductor integrated circuit is formed on a transparent substrate, for example, an optical device such as a liquid crystal display or an image sensor. Since these devices needs to be formed on a large area the TFT producing process needs to be done at a lower temperature. Further, since a device having a number of external terminals on a substrate has a difficulty in connecting said external terminals to external circuits, it has been suggested that the circuits corresponding those external circuits are monolithically formed on the same insulating substrate. FIG. 7 shows a block diagram of an example of such a monolithic type integrated circuit. In the figure, a monolithic type active matrix circuit is shown. On one substrate 7, an active matrix circuit 3, peripheral driving circuits 1 and 2 and bus lines 5 and 6 for connecting the active matrix circuit and the peripheral driving circuit. The active matrix circuit 3 includes a number of pixels 4 each of which comprises a TFT 8, pixel electrode 9 connected to an optical modulating medium 10 such as liquid crystal. In this structure, the above mentioned problem reducing the connection is avoided.

However, the electrical characteristics needed for TFTs of the driving circuit is generally different from that needed for TFTs of the active matrix circuit. For example, the active matrix circuit needs to have a sufficiently low leak current (off current) property when a reverse bias voltage is applied to a gate electrode. On the other hand, the peripheral driving circuit is required to have a sufficiently high mobility. If a monolithic active matrix device having more than 1000 scanning lines is to be formed, those TFTs in the peripheral driving circuit must have a mobility higher than 150 cm$^2$/V s and an ON/OFF ratio of a drain current in the active matrix circuit must be 7 digits or more. It was almost impossible to achieve these properties simultaneously in the case of using a non-single crystalline semiconductor for the TFTs.

Crystalline TFTs have been proposed to be used for an active matrix liquid crystal device or an image sensor device. FIGS. 3A–3F are cross sectional views showing an example of a manufacturing method of a TFT in accordance with a prior art.

Figure 3A:
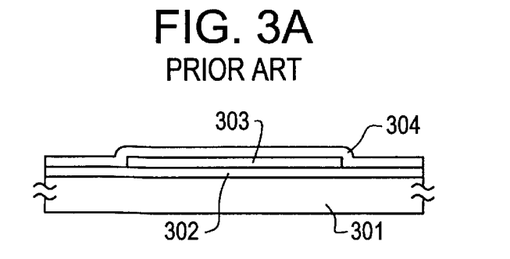
FIGS. 3A–3F are cross sectional views showing a manufacturing method of an insulated gate field effect transistor in accordance with prior art.

Referring to FIG. 3A, a base film 302 and an active layer 303 of crystalline silicon are formed on a substrate 301. An insulating film 304 is formed on the active layer using silicon oxide or the like.

Figure 3B:
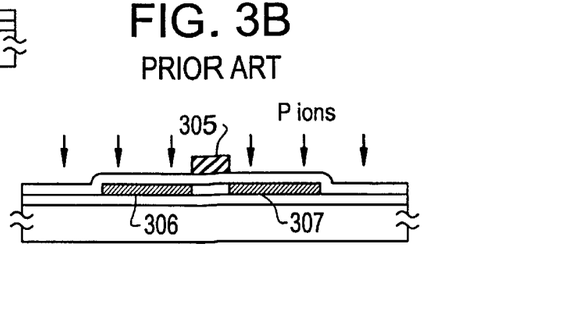

Then, a gate electrode 305 is formed of phosphorous doped polysilicon, tantalum, titanium, or aluminum, etc. With this gate electrode used as a mask, an impurity element (e.g. phosphorous or boron) is doped into the active layer 303 by an appropriate method such as ion-doping in a self-aligning manner, thereby, forming impurity regions 306 and 307 containing the impurity at a relatively lower concentration and therefore having a relatively high resistance. These regions 306 and 307 are called a high resistance region (HRD: High Resistivity Drain) by the present inventors hereinafter. The portion of the active layer below the gate electrode which is not doped with the impurity will be a channel region. After that, the doped impurity is activated using laser or a heat source such as a flush lamp. (FIG. 3B)

Figure 3C:
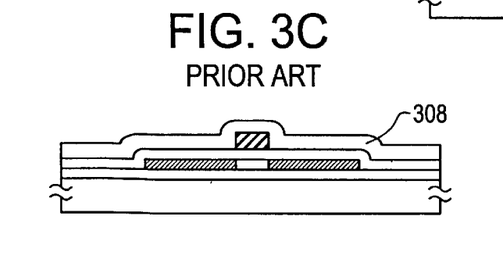
Figure 3D:
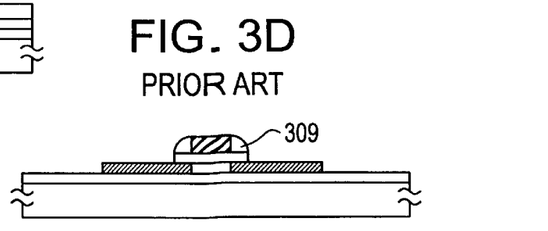

Referring to FIG. 3C, an insulating film 308 of silicon oxide is formed through a plasma CVD or APCVD (atmospheric pressure CVD), following which an anisotropic etching is performed to leave an insulating material 309 (side spacer) adjacent to the side surfaces of the gate electrode as shown in FIG. 3D.

Figure 3E:
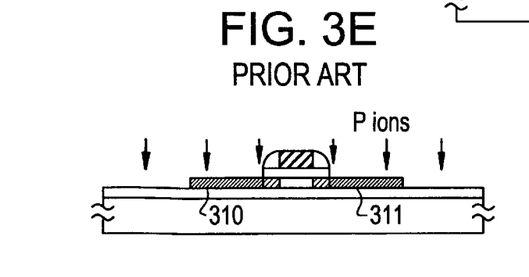

Referring to FIG. 3E, using the gate electrode 305 and the side spacer 309 as a mask, an impurity is introduced by ion doping or the like in order to form impurity regions 310 and 311 having a higher impurity concentration within the active layer 303. The impurity regions 310 and 311 have a low resistivity and are to become source and drain regions. Accordingly, there are two independent steps of introducing an impurity to the active layer and a step of an anisotropic etching between the two impurity introducing steps.

Figure 3F:
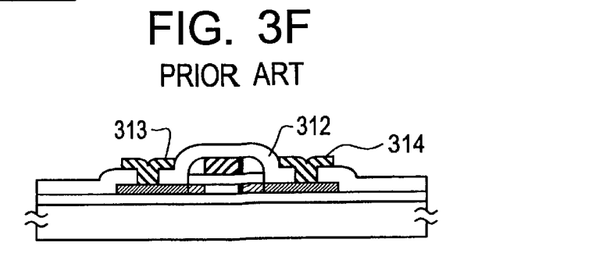

Then, the doped impurity is activated by means of a laser or a flush lump. Finally, as shown in FIG. 3F, an interlayer insulating film 312 is formed following which contact holes are formed on the source and drain regions through the interlayer insulating film. Further, through the contact holes, electrode/wirings 313 and 314 are formed from a metallic material such as aluminum.

The foregoing process was achieved pursuant to the known LDD technique for a conventional semiconductor integrate circuit and this method has some disadvantages for a thin film process on a glass substrate as discussed below.

Initially, it is necessary to activate the added impurity element with laser or flush lamp two times. Moreover, there exists a step of an anisotropic etching between these steps so that it is necessary to take out a substrate from a vacuum chamber. For this reason, the productivity is lowered. In the case of a conventional semiconductor circuit using a semiconductor substrate, the activation of an impurity can be carried out by a heat annealing at one time after completely finishing the introduction of the impurity (namely, after a step corresponding to FIG. 3F.)

However, in the case of forming TFTs on a glass substrate, the high temperature of the heat annealing tends to damage the glass substrate. Therefore, the use of laser annealing or flush lamp annealing is necessary. However, these annealing is effected on the active layer selectively, that is, the portion of the active layer below the insulating material (side spacer) 309 is not annealed, for example. Accordingly, the annealing step should be carried out at each time after an impurity doping is done.

Also, it is difficult to form the insulating material 309 accurately. Generally, the insulating film 308 is as thick as 0.5 to 2 $\mu$m while the base film 302 on the substrate is 1000–3000 Å thick. Accordingly, there is a danger that the base layer 302 is unintentionally etched and the substrate is exposed when etching the insulating film 308. As a result, a production yield can not be increased because substrates for TFTs contain a lot of elements harmful for silicon semiconductors.

Further, it is difficult to control the thickness of the insulating material 309 accurately. The anisotropic etching is performed by a plasma dry etching such as a reactive ion etching (RIE). However, because of the use of a substrate having an insulating surface as is different from the use of a silicon substrate, the delicate control of the plasma is difficult. Therefore, the formation of the insulating material 309 is difficult.

Since the above HRD should be made as thin as possible, the foregoing difficulty in precisely controlling the formation of the insulating material 309 makes it difficult to mass produce the TFT with a uniform quality.

SUMMARY OF THE INVENTION

It is an object of the present invention to provide a TFT having a high resistance region (HRD) through a simplified process instead of the foregoing complicated process. Here, the HRD includes not only a region which contains an impurity at a relatively low concentration and has a relatively high resistivity, but also includes a region which has a relatively high resistivity because of an addition of an element for preventing the activation of the dopant impurity even though the concentration of the dopant impurity is relatively high. Examples of such element are carbon, oxygen and nitrogen. By the provision of the HRD regions adjacent to a channel region, it is possible to suppress the occurrence of hot carriers, and reduce degradation, resulting in an increase of a reliability.

It is a further object of the present invention to manufacture of both high speed type TFTs and low leak current type TFTs on one substrate through a relatively simple manufacturing process.

In accordance with a first aspect of the present invention, a surface of a gate electrode is oxidized and this oxide layer is used to define the high resistivity region. The oxide layer is formed, preferably, by anodic oxidation. The use of the anodic oxidation to form the oxide layer is advantageous as compared with the step employing the anisotropic etching mentioned above because the thickness of the anodic oxide layer can be precisely controlled and can be formed as thin as 1000 Å or less or as thick as 5000 Å or more with an excellent uniformity.

Further, it is another feature of the present invention that there are two kinds of anodic oxide in the above mentioned anodic oxide layer. One is called a barrier type anodic oxide and the other is called a porous type anodic oxide. The porous anodic oxide layer can be formed when using an acid electrolyte. A pH of the electrolyte is lower than 2.0, for example, 0.8–1.1 in the case of using an oxalic acid aqueous solution. The resistance of such a film is very low so that the thickness of the film can be easily increased. On the other hand, the barrier type anodic oxide is formed using a weaker acid or approximately neutral electrolyte. Since the metal is not dissolved by the electrolyte, the resultant anodic oxide becomes dense and highly insulating. An appropriate range of pH of the electrolyte for forming the barrier type anodic oxide is higher than 2.0, preferably, higher than 3, more preferably, between 6.8 and 7.1.

While the barrier type anodic oxide can not be etched unless a hydrofluoric acid containing etchant is used, the porous type anodic oxide can be relatively easily etched with a phosphoric acid etchant, which can be used without damaging other materials constructing a TFT, for example, silicon or silicon oxide. Also, both of the barrier type anodic oxide and the porous type anodic oxide are hardly etched by dry etching. In particular, both types of the anodic oxides have a sufficiently high selection ratio of etching with respect to silicon oxide.

By using the anodic oxide film around the gate electrode, it is possible to determine the HRD region in the active layer.

As a material for the gate electrode which can be anodic oxidized, aluminum, tantalum, titanium, or silicon can be used. These materials are combined in a multilayer structure. For example, a titanium silicide may be laminated on an aluminum film, or vice versa.

Figure 4A:
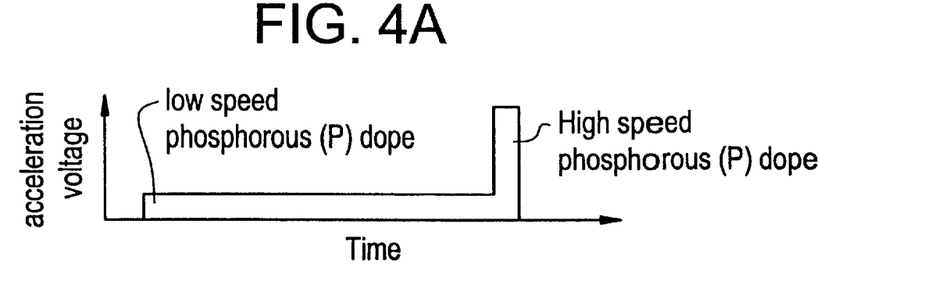
FIGS. 4A–4D are diagrams showing a variation of acceleration voltage with time during ion doping in accordance with the present invention.
Figure 4B:
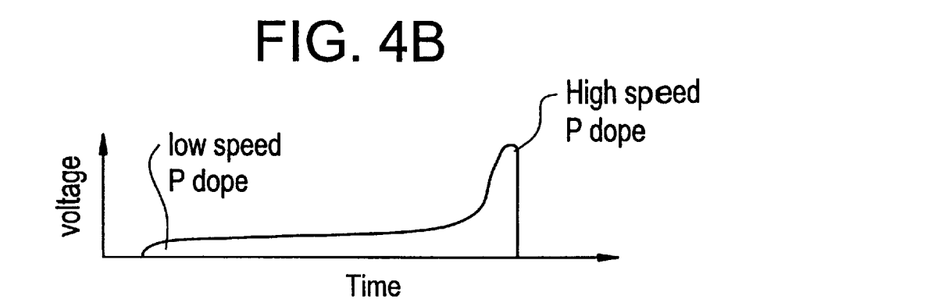

In accordance with another feature of the present invention, the introduction of an impurity into the active layer is carried out through an insulating film formed on a portion of the active layer and this introduction is carried out twice at different conditions as shown in FIG. 4A or 4B. That is, in a configuration shown in FIG. 1E, phosphorous ions are introduced into the active layer 103 through an insulating film 104' at a relatively lower acceleration energy. At this time, the impurity can not pass through the insulating film 104' so that the phosphorous ions are mainly added to the regions 110 and 113. Subsequently, phosphorous ions are introduced at a higher acceleration energy so that the accelerated ions can be introduced into the regions 111 and 112 through the insulating film. Thus, it is possible to form source and drain regions 110 and 113 having a higher impurity concentration and high resistivity regions 111 and 112 having a lower impurity concentration. The order of these steps may be reversed. Also, it is possible to change the condition of introducing impurity ion such as acceleration voltage monotonously or in a stepwise manner.

In accordance with a second aspect of the present invention, crystallinity of a semiconductor film formed on a substrate is selectively improved by means of an intense light such as a pulsed laser, visible light ray or infrared ray in order to form a plurality of TFTs having various electrical characteristics on one substrate.

For example, TFTs comprising crystalline silicon obtained by an intense light have a high speed and a high mobility, however, the off current thereof is relatively larger and are not suitable for an active matrix circuit. On the other hand, TFTs comprising amorphous silicon can not be used for a driving circuit but a leak current thereof is sufficiently low. Therefore, the second aspect of the present invention is characterized by the use of crystalline TFTs for a driving circuit and amorphous TFTs for an active matrix circuit.

Further, it is preferable that the crystalline TFTs are provided with a silicide layer or a low resistance layer within the regions corresponding to the source and drain regions in order to reduce the sheet resistance.

Further, by constituting a peripheral driving circuit with TFTs of a top-gate structure, the ion doping of the active layer can be made in a self-aligning manner so that a parasitic capacitance can be reduced, resulting in increase of an operational speed.

In the case of using a pulsed laser, a UV light laser such as an excimer laser of KrF, ArF, XeCl or XeF is suitable. Also, the characteristics of a TFT can be changed by changing the irradiation condition of the laser. Generally, the larger the energy density of the laser is, the larger the mobility of the TFT is.

However, this depends upon the material of the semiconductor and the wavelength of the laser. If the energy density is too high, there is a possibility that the characteristics for the TFT is degraded. The same applies to a shot number of the laser irradiation. In accordance with the present inventors' knowledge, when a KrF excimer laser (wavelength 248 nm, pulse width 10 nsec) is used, the preferred shot number is 1–50 times and the preferred energy density is 200–350 mJ/cm$^2$.

In this case, if a laser irradiation overlaps, the characteristics of the TFT of this portion tends to be determined by the condition of the first laser irradiation. Generally, the characteristics of a portion on which laser irradiations overlap tends to deteriorate. In the present invention, since only a peripheral circuit is crystallized by a laser irradiation, it is advantageous if the laser beam is shaped in a same form as the shape of the peripheral circuit region. However, in the case that a peripheral circuit portion and an active matrix portion are formed on a same plane and they are located near with each other (as is the case in Example 4 described later), it is necessary to use an appropriate mask because even a small amount of light leak would cause a large influence on the surrounding semiconductor. On the other hand, when the peripheral circuit and the active matrix circuit are formed within different layers, such a care is not necessary.

The foregoing and other features of the invention will be further clarified in preferred embodiments of the invention with reference to the attached drawings.

PREFERRED EMBODIMENTS OF THE INVENTION

Figure 1A:
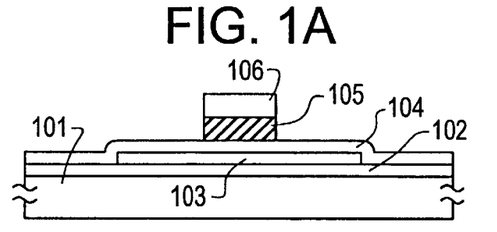
FIGS. 1A–1F are cross sectional views showing a manufacturing method of an insulated gate field effect transistor in accordance with Example 1 of the present invention.

Referring to FIG. 1A, provided on a substrate 101 is a base insulating film 102. An active layer 103 comprising a crystalline silicon semiconductor is formed on the base insulating film 102. In this invention, "crystalline semiconductor" includes single crystalline, polycrystalline or semi-amorphous semiconductor, in which crystal components are contained at least partly. Further, an insulating film 104 comprising silicon oxide or the like is formed, covering the active layer 103.

Further, on the insulating film 104, a film comprising an anodizable material is formed. Examples of the anodizable material is aluminum, tantalum, titanium, silicon, etc. These materials can be used singly or in a multilayer form using two or more of them. For example, it is possible to use a double layer structure in which titanium silicide is formed on aluminum, or aluminum is formed on a titanium nitride. The thickness of each layer may be determined in accordance with a required device property.

Subsequently, a mask material is formed on the anodizable material following which these films are patterned into a gate electrode 105 and a mask 106. As a mask material, it is possible to use a photoresist material which is usually used in a photolithography step, photosensitive polyimide or any polyimide which can be etched.

Figure 1B:
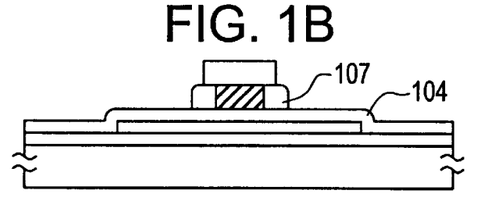

Then, referring to FIG. 1B, the gate electrode 105 is anodized by supplying an electric current thereto in an electrolyte to form a porous anodic oxide 107 on a side surface thereof. As the electrolyte for this anodic oxidation, an acid aqueous solution containing citric acid, oxalic acid, phosphoric acid, chromic acid, or sulfuric acid at 3–20% is used. The applied voltage is in the range of 5 to 30 V and the thickness is 0.5 $\mu$m or more.

Figure 1C:
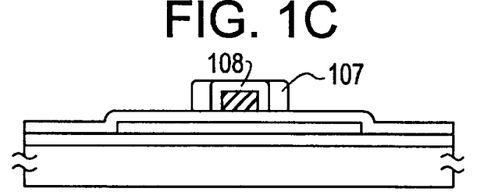
Figure 1D:
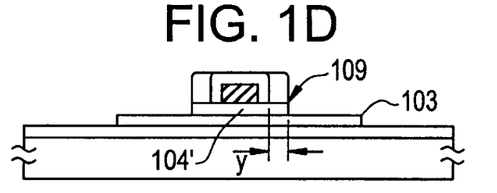

Referring to FIG. 1D, the insulating film 104 is etched by dry etching or wet etching with the anodic oxide film 106 used as a mask. The etching may be continued until the surface of the active layer is exposed or may be stopped before the surface of the active layer is exposed. However, it is preferable to continue the etching until the surface of the active layer is exposed in view of a productivity, production yield, and uniformity. The portion of the insulating film 104 under the gate electrode 105 and the anodic oxide film 106 remains as a gate insulating film 104'. When using aluminum, tantalum or titanium as a main component of the gate electrode while the gate insulating film 104 comprises silicon oxide, it is possible to use a fluorine containing etchant such as $NF_3$ and $SF_6$ for a dry etching. In this case, the insulating film 104 is etched quickly while the etching rate of aluminum oxide, tantalum oxide and titanium oxide is enough small so that the selective etching of the insulating film 104 can be done.

Also, in the case of using a wet etching, it is possible to use a hydrofluoric acid containing etchant such as a 1/100 hydrofluoric acid. In this case, the silicon oxide insulating film 104 can also be selectively etched because the etching rate of the oxide of the aluminum, tantalum, and titanium is enough small.

After etching the insulating film 104, the anodic oxide film 107 is removed. As an etchant, a solution containing phosphoric acid may be used. For example, a mixed acid of a phosphoric acid, an acetic acid and a nitric acid is desirable. However, when using aluminum as a gate electrode, the gate electrode is also etched by the etchant. In accordance with the present invention, this problem is solved by the provision of a barrier type anodic oxide film 108 between the gate electrode and the anodic oxide 107 as shown in FIG. 1C. The thickness of this anodic oxide layer is determined by a magnitude of a voltage applied to the gate electrode during the anodic oxidation.

The barrier type anodic oxide film 108 can be formed by applying an electric current to the gate electrode after the formation of the porous anodic oxide 107 between the gate electrode and the porous type anodic oxide film. The etching rate of the porous type anodic oxide is 10 times higher than that of the barrier type anodic oxide. Accordingly, the barrier type anodic oxide layer functions to protect the gate electrode when etching the porous anodic oxide layer 107 using a phosphoric acid containing acid as an etchant. Accordingly, the porous anodic oxide 107 can be removed by the phosphoric acid containing etchant without damaging the gate electrode.

Since the gate insulating film 104' is formed in a self-aligning manner with respect to the porous anodic oxide 107, the outer edge of the gate insulating film 104' is distant from the outer edge of the barrier type anodic oxide 108 by the distance "y" as shown in FIG. 1D. One of the advantages of the use of an anodic oxide is that this distance "y" can be decided by the thickness of the anodic oxide in a self-aligning manner.

In the foregoing configuration, the introduction of an impurity into the active layer is carried out at least two times with different acceleration conditions as set forth above. through the insulating film formed on a portion of the active layer. That is, referring to FIG. 1E, phosphorous ions (for example) are introduced into the active layer 103 through the insulating film 104' at a relatively lower acceleration energy. At this time, the insulating film 104' almost blocks the impurity so that the phosphorous ions are added only to the regions 110 and 113. Then, referring to FIG. 1F, phosphorous ions are introduced at a higher acceleration energy so that the accelerated ions can be introduced into the regions 111 and 112 below the insulating film. Thus, it is possible to form source and drain regions 110 and 113 having a higher impurity concentration and high resistance regions 111 and 112 having a lower impurity concentration. The dose amount in the case of the lower acceleration energy should be larger than that in the case of the higher acceleration energy. These introduction steps can be carried out with a same equipment without a necessity of substantially interrupting the process. Namely, these introduction steps may be carried out in substantially one step.

As explained above, the high resistance regions 111 and 112 can be determined in a self-aligning manner by the thickness "y" of the anodic oxide film 107 which in turn is decided by the amount of the electric current supplied to the gate electrode during the anodic oxidation step. This is much superior to the use of an insulating material adjacent to the gate electrode as shown in FIGS. 3A–3F.

The foregoing method is advantageous because the low resistance regions and the high resistance regions can be formed with a substantially single impurity doping step. Also, in the prior art, there is a problem that the HRD is difficult to contact with an electrode in an ohmic contact because of its high resistivity and a drain voltage is undesirably lowered because of this resistivity while the HRD has an advantage that it is possible to avoid the occurrence of hot carriers and to increase the reliability of the device. The present invention solves these conflicting problems at one time and makes it possible to form the HRD having a width of 0.1 to 1 $\mu$m in a self-aligning manner and enables an ohmic contact between the electrodes and the source and drain regions.

In general, the offset structure reduces a reverse direction leak current (off current) and increases the ON/OFF ratio. The offset structure is suitable for TFTs used for driving pixels of a liquid crystal device in which the leak current should be avoided as much as possible.

EXAMPLE 1

More specific example in accordance with the first aspect of the present invention will be described referring again to FIGS. 1A–1F. A Corning 7059 glass substrate having a dimension 300 mm×400 mm or 100 mm×100 mm is used as the substrate 101. A silicon oxide film having a thickness of 1000–3000 Å is formed on the substrate as the base film 102 through sputtering in an oxygen gas, for example. However, it is possible to use a plasma CVD using TEOS as a starting material in order to improve the productivity.

A crystalline silicon film 103 in the form of an island is formed by depositing an amorphous silicon to a thickness of 300–5000 Å, preferably, 500–1000 Å through plasma CVD or LPCVD, then crystallizing it by heating at 550–600° C. for 4 to 24 hours in a reducing atmosphere and then patterning it into an island form. Instead of a heat annealing, a laser annealing may be employed. Further, a silicon oxide film 104 is formed thereon by sputtering to a thickness of 70–150 nm.

An aluminum film of 1000 Å to 3 $\mu$m is formed on the insulating film 104 by electron beam evaporation or sputtering. The aluminum may contain an appropriate additive, for example, silicon at 1 weight % or scandium (Sc) at 0.1 to 0.3 weight %. After forming the aluminum film on the gate insulating film 104, a photoresist (OFPR 800/30 cp manufactured by Tokyo Oka) is spin coated. It is desirable to form an anodic oxide film of 100–1000 Å on the aluminum film prior to the formation of the photoresist film in order to increase adhesivity of the photoresist and to prevent a leak current through the photoresist during the subsequent anodic oxidation step. Then, these films are patterned into a gate electrode 105 and a mask 106 as shown in FIG. 1A.

Referring to FIG. 1B, the gate electrode 105 is anodic oxidized by applying a current thereto in an electrolyte to form an anodic oxide film 107 having a thickness of 3000–6000 Å, for example 5000 Å. As the electrolyte, an acid aqueous solution of citric acid, oxalic acid, phosphoric acid, chromic acid, or sulfuric acid at 3–20% is used. The applied voltage is 5–30 V while the applied current is kept constant. In this example, an oxalic acid is used. The temperature of the electrolyte is 30° C. A voltage of 8 V is applied for 20–40 minutes. The thickness of the anodic oxide film is controlled mainly by changing the duration of the anodic oxidation. Preferably, the magnitude of the voltage is lower than that used in the anodic oxidation which is carried out prior to the formation of the photoresist.

Subsequently, after removing the mask 106, the gate electrode is again subjected to a further anodic oxidation in another electrolyte comprising an ethylene glycol solution containing tartaric acid, boric acid or nitric acid at 3–10% to form a barrier type anodic oxide film 108 around the gate electrode. The temperature of the electrolyte is kept preferably lower than a room temperature, for example, 10° C., in order to improve the quality of the oxide film. The thickness of the anodic oxide film 108 is in proportion to the magnitude of the applied voltage. When the applied voltage is 150 V, the thickness becomes 2000 Å. The thickness of the anodic oxide film 108 is determined in accordance with a desired thickness of the offset regions, however, it is necessary to raise the voltage to 250 V or higher if an anodic oxide film having a thickness of 3000 Å or more is to be formed. Since there is a danger that the TFT is damaged by such a large voltage, it is preferable to select the thickness of the anodic oxide 108 as 3000 Å or less.

Referring to FIG. 1D, the silicon oxide film 104 is partly removed by dry etching. This etching may be either in a plasma mode of an isotropic etching or in a reactive ion etching mode of an anisotropic etching. However, the selection ratio of the silicon and the silicon oxide should be sufficiently large so that the active silicon layer should not be etched so much. Also, the anodic oxides 107 and 108 are not etched by $CF_4$ while the silicon oxide film 104 is selectively etched. Since the portion of the silicon oxide film 104 below the porous anodic oxide 107 is not etched, a portion of the insulating film remains without being etched as a gate insulating film 104'.

Figure 1E:
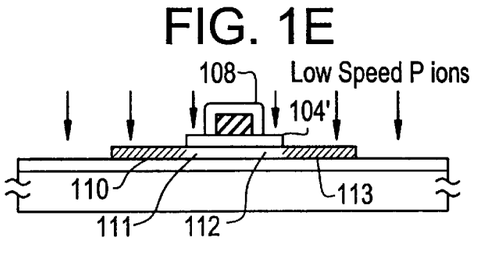

Then, referring to FIG. 1E, only the porous anodic oxide film 106 is etched by using a mixed acid of phosphoric acid, acetic acid or nitric acid at an etching rate, for example, 600 Å/minute. The gate insulating film 104' remains without being etched off.

After removing the porous anodic oxide film 107, an impurity element for giving the semiconductor layer one conductivity type is added by ion doping method with the gate electrode and the barrier type anodic oxide film 108 and the gate insulating film 104' used as a mask in a self-aligning manner in order to form source and drain regions 110 and 113 having a lower resistance and high resistance regions 111 and 112. In the case of forming p-type regions, diborane ($B_2H_6$) is used as a dopant gas. In the case of forming n-type regions, phosphine ($PH_3$) may be used. The acceleration condition is controlled in the following manner.

Figure 1F:
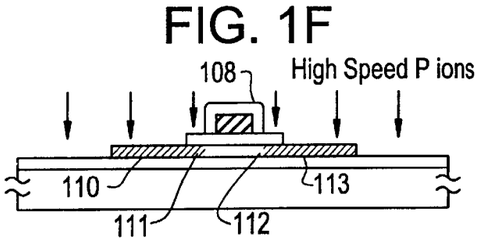

Namely, at first, the acceleration voltage is selected to be 1–30 kV, for example, 5 kV. The dose amount is $5\times10^{14}$ to $5\times10^{15}$ cm$^{-2}$, for example, $1\times10^{15}$. As a result, only the portions 110 and 113 which are not covered with the gate insulating film 104' are doped with the impurity at a concentration $5\times10^{19}$ to $5\times10^{20}$ atoms/cm$^3$ as shown in FIG. 1E. Then, the acceleration voltage is raised to 65–110 kV, for example, 90 kv. The dose amount is $5\times10^{12}$ to $5\times10^{13}$ cm$^{-2}$, for example, $1\times10^{13}$ cm$^{-2}$. As a result, mainly, the regions 111 and 112 covered with the gate insulating film 104' are doped with the impurity at a concentration $5\times10^{17}$ to $5\times10^{18}$ atoms/cm$^3$ as shown in FIG. 1F.

Finally, the introduced impurity in the active layer is activated by using a KrF excimer laser of which wave length is 248 nm and a pulse width is 20 nsec.

EXAMPLE 2

Another example in accordance with a first aspect of the present invention will be described with reference to FIGS. 2A–2F.

Figure 2A:
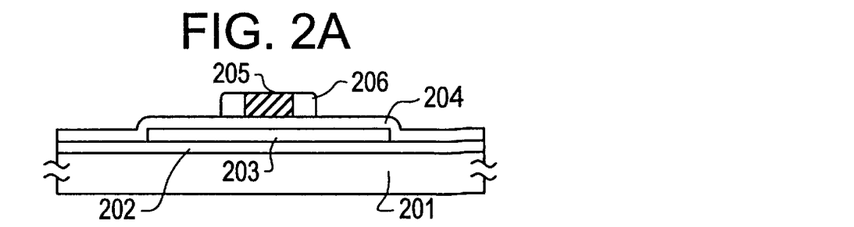
FIGS. 2A–2F are cross sectional views showing a manufacturing method of an insulated gate field effect transistor in accordance with Example 2 of the present invention.

Referring to FIG. 2A, an underlying silicon oxide film 202, an island form crystalline silicon semiconductor region 203, a silicon oxide film 204, a gate electrode of an aluminum film (200 nm–1 μm thick) and a porous anodic oxide film 206 (3000 Å–1 μm, e.g. 5000 Å) formed on the side surface of the gate electrode are formed on a glass substrate, for example, NA35 glass manufactured by NH Technoglass through the same steps shown in FIGS. 1A and 1B as explained in Example 1.

Figure 2B:
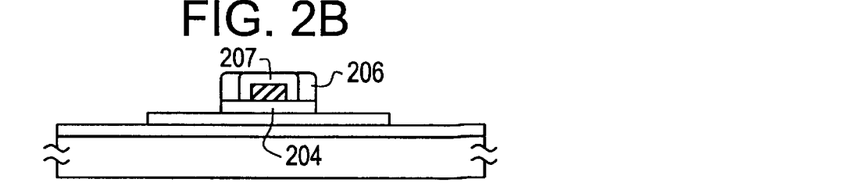

Referring to FIG. 2B, a barrier type anodic oxide film 207 is formed to 1000–2500 Å thick in the same manner as in the Example 1. Further, the silicon oxide film 204 is etched with a porous anodic oxide 206 as a mask to form a gate insulating film 204'.

Figure 2C:
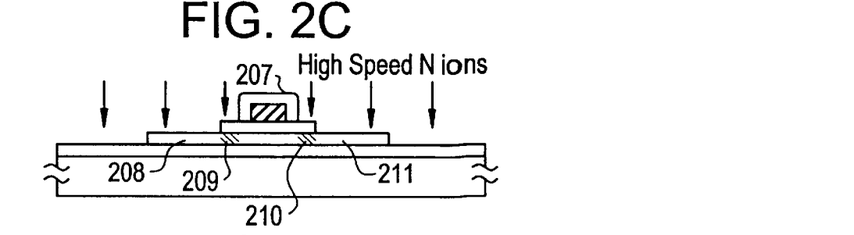
Figure 2D:
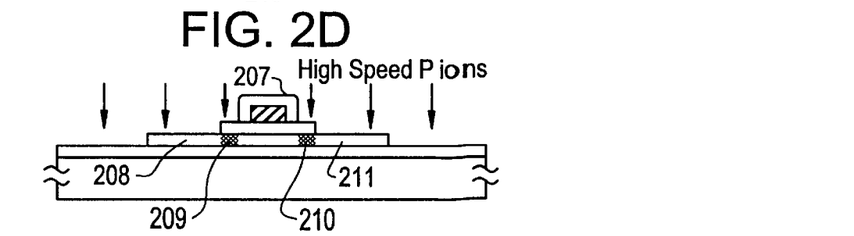

Subsequently, the porous anodic oxide film is removed by etching using the barrier type anodic oxide film 207 as a mask as shown in FIG. 2C. Then, nitrogen ions are introduced by ion doping using the gate electrode 205 and the anodic oxide 207 and the gate insulating film 204' as masks. Nitrogen gas ($N_2$) is used as a doping gas. The dose amount is $1\times10^{14}$–$3\times10^{16}$ cm$^{-2}$, for example, $2\times10^{15}$ cm$^{-2}$. The acceleration voltage is 65–110 kV, for example, 80 kV. At this condition, the nitrogen ions have a high speed so that they almost pass through the regions 208 and 211 which are not covered with the gate insulating film 204'. Hence, the nitrogen ions are not substantially added to the regions 208 and 211 and the concentration is less than $1\times10^{19}$ atoms/cm$^3$ when measured by secondary ion mass spectroscopy (SIMS). On the other hand, the regions 209 and 210 which are covered with the gate insulating film 204' are doped with the nitrogen at a concentration of $5\times10^{19}$–$2\times10^{21}$ atoms/cm$^3$ as shown in FIG. 2C.

Figure 2E:
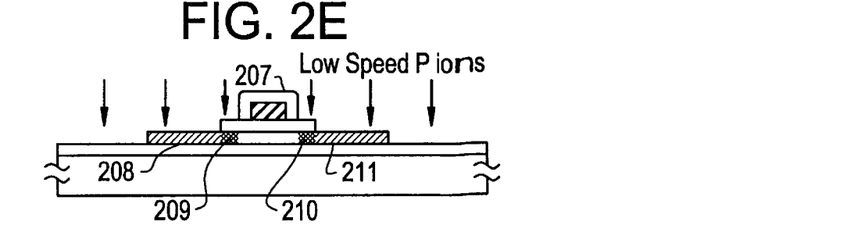

Then, the doping gas is changed to phosphine ($PH_3$) in order to introduce phosphorous. Initially, the acceleration voltage is set to be 65–110 kV, for example, 90 kV. The dose amount is $5\times10^{12}$–$5\times10^{13}$ cm$^{-2}$, for example, $1\times10^{13}$. As a result, the regions 209 and 210 which are covered with the gate insulating film 204' are mainly doped with the impurity at a concentration $5\times10^{17}$ to $5\times10^{18}$ atoms/cm$^3$. (FIG. 2D) Subsequently, keeping the substrate within the doping apparatus, the acceleration voltage is decreased to 1–30 kV, for example, 5 kV. The dose amount is changed to $5\times10^{14}$ to $5\times10^{15}$ cm$^{-2}$. As a result, the regions 208 and 211 which are not covered with the gate insulating film 204' are mainly doped with the impurity at a concentration $5\times10^{19}$ to $5\times10^{20}$ atoms/cm$^3$. (FIG. 2E)

In the foregoing manner, high resistance regions 209 and 210 and low resistance regions 208 and 211 are formed.

Thereafter, the introduced impurity ions are activated by KrF excimer laser (wavelength: 248 nm, pulse width: 20 nsec.). Other lasers such as XeCI excimer laser (308 nm wavelength and 50 nsec pulse width) may be used. As to examples of other pulsed lasers, there are a laser of an IR light such as Nd:YAG laser (Q switch pulse oscillation is preferred), a second harmonic wave of the Nd:YAG (visible light). Also, it is possible to emit the laser from the substrate side. In this case, it is necessary to select a laser which can transmit through the silicon.

Also, instead of the laser annealing, a lump annealing of visible light or near infrared light may be employed. In such a case, the annealing is performed in order to heat the surface of the temperature to be 600–1000° C., for example, for several minutes at 600° C. or several tens seconds at 1000° C. An annealing with a near infrared ray (e.g. 1.2 μm) does not heat the glass substrate so much because the near infrared ray is selectively absorbed by silicon semiconductors. Further, by shortening the irradiation time, it is possible to prevent the glass from being heated.

Figure 2F:
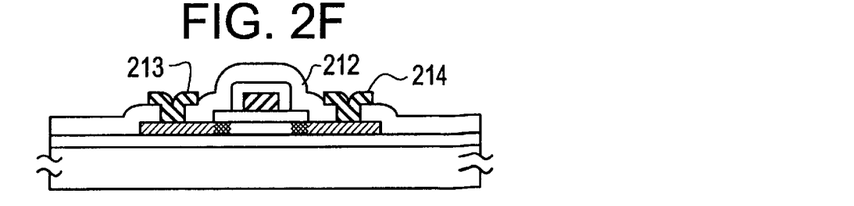

Finally, referring to FIG. 2F, an interlayer insulating film 212 is formed on the entire surface by depositing silicon oxide through CVD to a thickness of 2000 Å–1 μm, for example, 3000 Å, following which contact holes are formed therethrough on the source and drain regions. Further aluminum electrode/wiring 213, 214 are formed to a thickness of 2000 Å to 1 μm, for example, 5000 Å. It is further advantageous for improving the reliability if a titanium nitride is interposed between the low resistance regions 208 and 211 and the aluminum electrodes 213 and 214 as a barrier metal.

In the present example, the high resistance regions 209 and 210 are formed by doping nitrogen selectively. Oxygen or carbon may be used in place of nitrogen, alternatively, these may be used in combination. By the provision of the HRD regions, it is possible to reduce the leak current of the TFT. This is particularly advantageous when used as TFTs in an active matrix or the like which are required to have a high charge retention property.

Figure 4C:
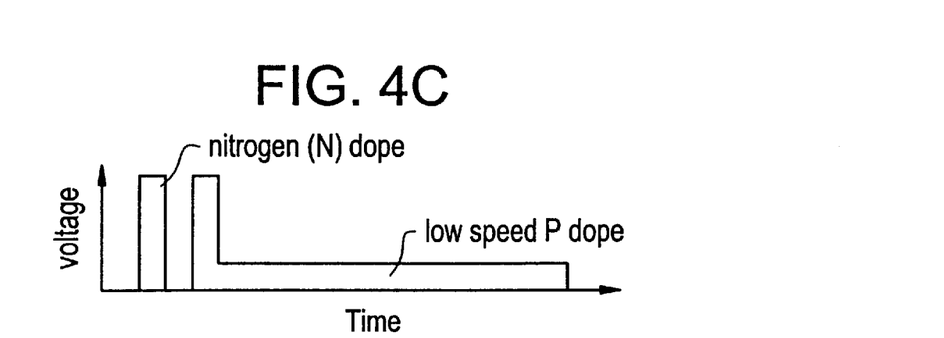
Figure 4D:
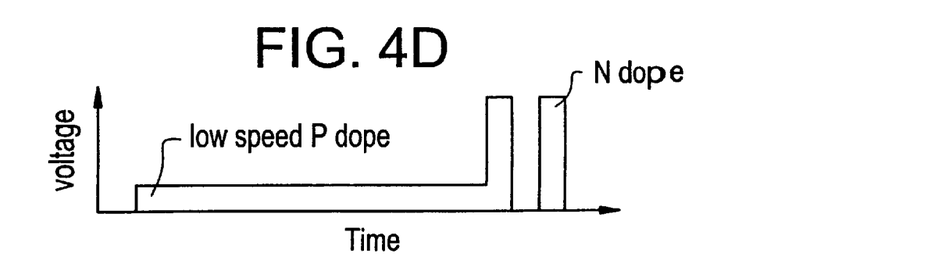

The condition of the doping process in the present example is shown in FIG. 4C, however, the introduction of the nitrogen may be performed later as shown in FIG. 4D. In any event, it is not necessary to take out a substrate from the doping apparatus.

EXAMPLE 3

The present Example is directed to a manufacture of an integrated circuit such as an active matrix circuit in accordance with the second aspect of the present invention. FIGS. 5A–5K are cross sectional views showing the manufacturing process.

Figure 5A:
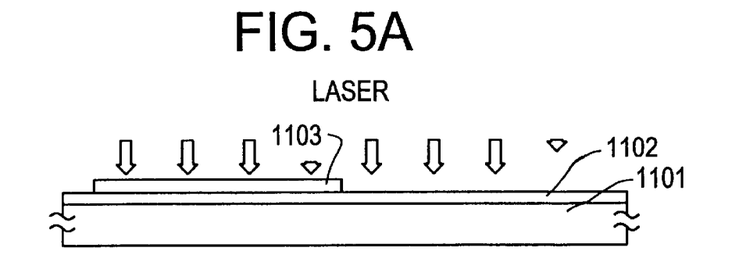
FIGS. 5A–5K are cross sectional views showing a manufacturing method of an insulated gate field effect transistor in accordance with Example 3 of the present invention.

Initially, referring to FIG. 5A, on a Corning 7059 substrate 1101 of 300 mm×300 mm or 100 mm×100 mm, an underlying silicon oxide film 1102 is formed to a thickness of 1000–3000 Å. The silicon oxide film may be formed by sputtering in an oxygen atmosphere or by plasma CVD using tetraethoxysilane (TEOS). Further, it is possible to anneal the deposited silicon oxide film at a temperature of 450–650° C.

Subsequently, an amorphous silicon film is formed to a thickness of 100–1500 Å, preferably, 300–700 Å through a plasma CVD or LPCVD and then patterned into an island region 1103. Then, the silicon film is heated at 350–550° C., for example, 400° C. in a nitrogen atmosphere for 0.1–5 hours, for example 0.5 hour in order to perform dehydrogenation. Thereafter, a KrF excimer laser (wavelength 248 nm, pulse width 20 nsec) is irradiated in order to crystallize the island form silicon film 1103. The energy density of the laser is 200–400 $mJ/cm^2$, for example, 250–300 $mJ/cm^2$. Also, it is desirable to heat the substrate at 200–550° C., for example, 400° C. during the laser irradiation in order to improve the crystallinity of the silicon. Instead of KrF excimer laser, it is possible to use a XeCl excimer laser (wavelength 308 nm).

Figure 5B:
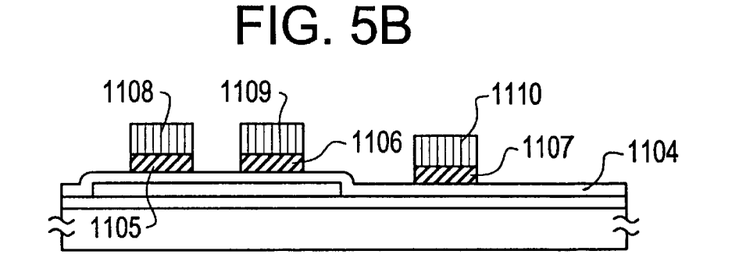

Referring to FIG. 5B, a silicon oxide film 1104 is deposited to a thickness of 800–1500 Å, e.g. 1200 Å by sputtering in an oxygen atmosphere or by plasma CVD using TEOS. Then, an aluminum film of 1000 Å to 3 $\mu$m is formed on the insulating film 1104 by electron beam evaporation or sputtering. The aluminum may contain an appropriate additive, for example, silicon at 1 weight % or scandium (Sc) at 0.1 to 0.3 weight %. After forming the aluminum film on the gate insulating film 1104, a photoresist (OFPR 800/30 cp manufactured by Tokyo Oka) is spin coated. It is desirable to form an anodic oxide film of 100–1000 Å on the aluminum film prior to the formation of the photoresist film in order to increase an adhesivity of the photoresist and to prevent a leak current through the photoresist during the subsequent anodic oxidation step.

The photoresist film is patterned by a known photolithography and the aluminum film is patterned. Thus, gate electrodes 1105 and 1106 of TFTs for a peripheral driving circuit and a gate electrode 1107 of a TFT (reverse staggered type) for an active matrix portion are formed. The photoresist film remains on these gate electrodes (wirings) as masks 1108 to 1110.

Figure 5C:
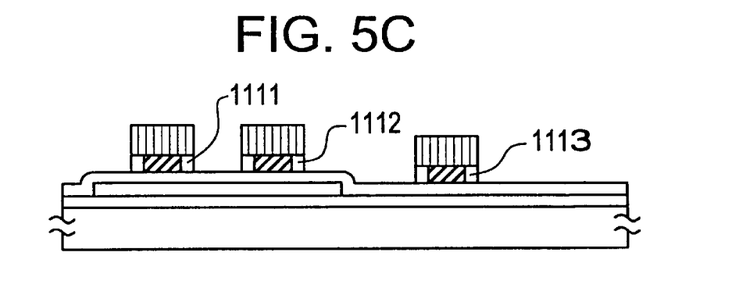

Then, referring to FIG. 5C, the electrodes 1105–1107 are anodic oxidized by applying an electric current in an electrolyte in order to form anodic oxide films 1111, 1112 and 1113 on the side surfaces of the gate electrodes. The photoresist 1108–1110 functions to prevent the upper surface of the gate electrodes to be anodized in this step. The thickness of the anodic oxide film is 3000 Å to 25 $\mu$m, for example, 0.5 $\mu$m. As the electrolyte, an acid aqueous solution of citric acid, oxalic acid, phosphoric acid, chromic acid, or sulfuric acid at 3–20% is used. The applied voltage is 5–30 V while the applied current is kept constant. In this example, an oxalic acid is used. The temperature of the electrolyte is 30–80° C. A voltage of 8 V is applied for 20–240 minutes.

Figure 5D:
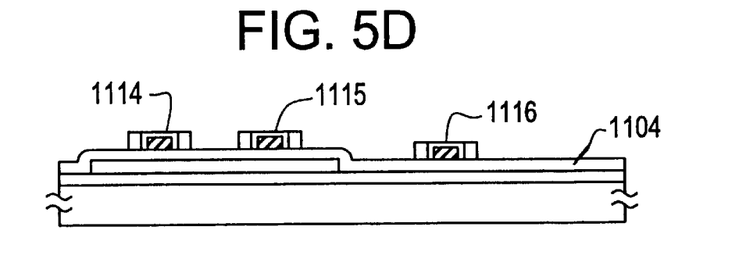

Subsequently, referring to FIG. 5D, after removing the masks 1108–1110, the gate electrode is again subjected to a further anodic oxidation in another electrolyte comprising an ethylene glycol solution containing tartaric acid, boric acid or nitric acid at 3–10%. The electrolyte is neutralized by ammonium so that the pH is controlled approximately to 7. The temperature of the electrolyte is kept preferably lower than a room temperature, for example, at 10° C., in order to improve the quality of the oxide film. Accordingly, barrier type anodic oxides 1114–1116 are formed on the upper and side surfaces of the gate electrodes 1105–1107. The thickness of these anodic oxide film is in proportion to the magnitude of the applied voltage. When the applied voltage is 100 V, the thickness becomes 1200 Å. In this example, since the voltage is increased to 100 V at an increasing rate of 1–5 volts/minute, an anodic oxide of 1200 Å is obtained. The thickness of the barrier type anodic oxide is preferably 500 Å or more in order to prevent the aluminum electrodes from being dissolved by an etchant during the etching of the porous anodic oxides.

Figure 5E:
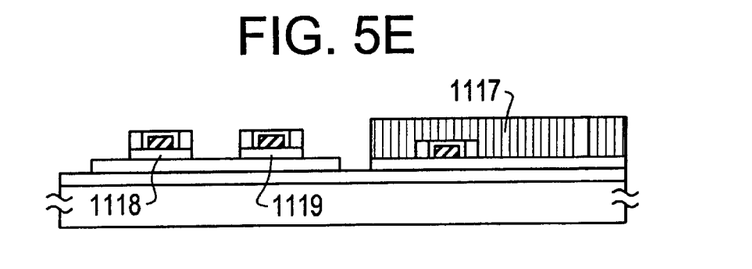

Referring to FIG. 5E, the silicon oxide film 1104 is patterned by dry etching. At this time, a region of the substrate corresponding to an active matrix circuit region is covered with a photoresist 1117 in order to avoid the etching. By doing so, it is possible to minimize a step around the gate electrode 1107 so that a step coverage of an amorphous silicon film which is to be formed later can be improved.

This etching may be either in a plasma mode of an isotropic etching or in a reactive ion etching mode of an anisotropic etching. However, the selection ratio of the silicon and the silicon oxide should be sufficiently large so that the active silicon layer should not be etched so much. When using $CF_4$ as an etchant gas, the anodic oxide materials are not etched and the gate electrodes 1105, 1106 and the surrounding anodic oxides 1111 and 1112 and the underlying silicon oxide film 1104 remain without being etched. Thus, gate insulating films 1118 and 1119 are formed as shown in FIG. 5E.

Figure 5F:
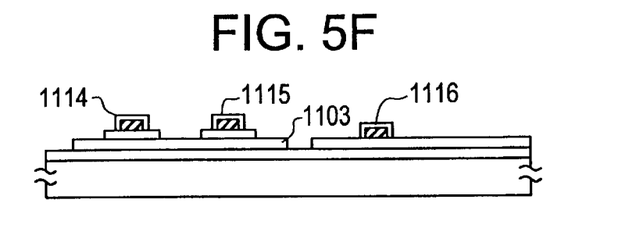

Referring to FIG. 5F, after removing the photoresist mask 117, a mixed acid of phosphoric acid, acetic acid and nitric acid is used to etch the porous anodic oxides 1111–1113 at an etching rate 600 Å/minute. The barrier type anodic oxides 1114–1116 and silicon oxide films 1102 and 1104 and silicon 1103 remain without being etched. The barrier type anodic oxide films 1114, 1115, 1116 protect the gate electrode during the etching.

Figure 5G:
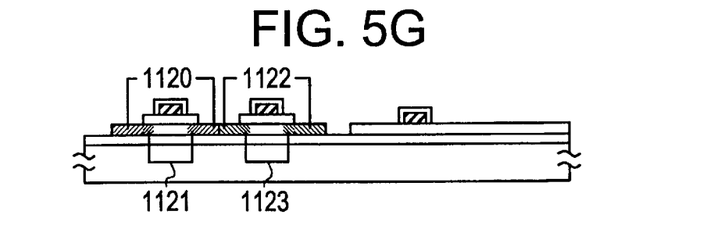

Then, referring to FIG. 5G, impurity ions (phosphorous and boron) are introduced by an ion doping method (also called as plasma doping method) by known CMOS technique in a self-aligning manner. Phosphine ($PH_3$) and diborane ($B_2H_6$) are used as doping gases. The gate electrodes 1105, 1106 and the surrounding anodic oxide films 1114, 1115 and the gate insulating films 1118, 1119 function as a mask. The formation condition of impurity regions are varied by changing the acceleration voltage and the dose amount of the ions.

For example, when the acceleration voltage is set to be relatively high, for example, 50–90 kV and the dose amount is set to be relatively low, for example, $1 \times 10^{13}$ to $1–10^{14}$ cm$^{-2}$, the introduced ions almost passes through the regions 1120, 1122 of the active layer which are not covered with the gate insulating film. Rather, the impurity ions are added at a maximum concentration in the underlying film. On the other hand, the introduced ions are slowed by the gate insulating films 1118 and 1119 so that the concentration of the impurity becomes maximum within the regions 1121, 1123 on which the gate insulating film exists.

On the contrary, when the acceleration voltage is set to be relatively low such as 5–30 kV and the dose amount is set to be relatively large such as $5 \times 10^{14}$ to $5 \times 10^{15}$ cm$^{-2}$, the regions 1120 and 1122 on which the gate insulating film does not exist are mainly added with the impurity at high concentration, while the other hand, the gate insulating film 1118, 1119 blocks the ions so that the regions 1121, 1123 are not so added with the impurity. Accordingly, the regions 1121, 1123 become impurity regions of a lower concentration in either methods.

In the former method, since the dose amount is relatively small, an injection energy per one unit area is small so that the substrate is hardly heated, namely, the temperature rise is only 1–10% of a normal through dope condition (90 kV, $1 \times 10^{15}$ cm$^{-2}$). Accordingly, it is possible to avoid a carbonization of a photoresist. Also, in the latter method, while the dose amount is larger than in the former, since the acceleration voltage is enough low so that the temperature rise of the substrate is 5–40% of that in the normal case.

The thus obtained low concentration impurity regions 1121, 1123 and the offset regions which are not added with the impurity because of the existence of the barrier type anodic oxide film function as a high resistance semiconductor region. In this example, the width of it is about 0.5 μm.

Figure 5H:
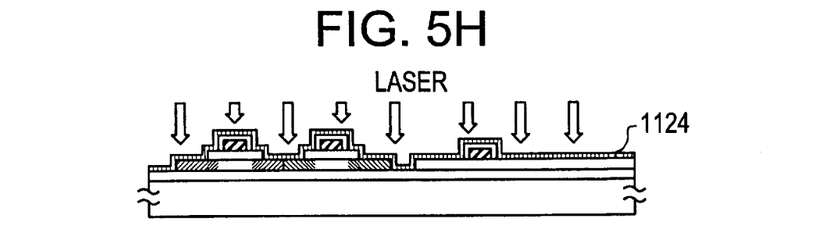

Then, referring to FIG. 5H, a metal which is capable of forming a silicide in contact with silicon, for example, titanium, nickel, molybdenum, tungsten, platinum or palladium is formed on the entire surface. For example, a titanium film 1124 is formed by sputtering to a thickness of 50–500 Å. Accordingly, the impurity regions 1120, 1122 added with the impurity at a high concentration are directly contacted with the metal film 1124.

Then, a KrF excimer laser (wavelength 248 nm, pulse width 20 nsec) is irradiated in order to make the metal react with the silicon and form titanium silicide regions 1125, 1126, 1127. The energy density of the laser is 200–400 mJ/cm$^2$, preferably, 250–300 mJ/cm$^2$. Also, the substrate may be heated to 200–500° C. during the laser irradiation in order to avoid pealing of the titanium film. Further, the impurity regions 1121, 1123 of which crystallinity has been damaged due to the former ion doping steps are simultaneously activated by the laser irradiation. Since the impurity regions 1121, 1123 do not contact the metal film, the silicidation does not occur in these regions.

It is possible to use other light sources other than excimer laser. However, a pulsed laser beam is more preferable than a CW laser because a CW laser requires a longer irradiation time and there is a danger that the irradiated film is thermally expanded and peels off.

As to examples of pulsed laser, there are a laser of an IR light such as Nd:YAG laser (Q switch pulse oscillation is preferred), a second harmonic wave of the Nd:YAG (visible light), and a laser of a UV light such as excimer laser of KrF, XeCl and ArF. When the laser beam is emitted from the upper side of the metal film, it is necessary to select wavelengths of the laser in order not to be reflected on the metal film. However, there is no problem when the metal film is enough thin. Also, it is possible to emit the laser from the substrate side. In this case, it is necessary to select a laser which can transmit through the silicon.

Also, instead of the laser annealing, a lump annealing of visible light or near infrared light may be employed. In such a case, the annealing is performed in order to beat the surface to 600–1000° C., for example, for several minutes at 600° C. or several tens seconds at 1000° C. An annealing with a near infrared ray (e.g. 1.2 μm) does not heat the glass substrate so much because the near infrared ray is selectively absorbed by silicon semiconductors. Further, by shortening the irradiation time, it is possible to prevent the glass from being heated.

Figure 5I:
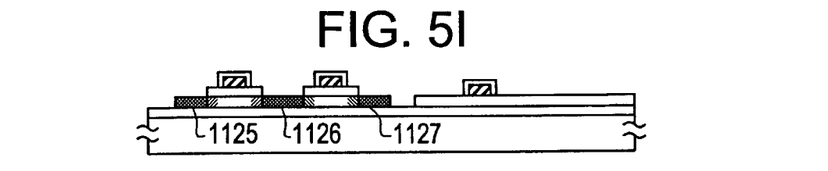

Thereafter, referring to FIG. 5I, only the titanium film remaining without converting into a silicide, for example, on the gate electrode or gate insulating film, is etched off by using an etchant containing hydrogen peroxide, ammonium and water at 5:2:2. As a result, titanium silicide regions 1125, 1126, 1127 remain without being etched. The sheet resistance of the thus obtained silicide regions is 10–50 kΩ/square while that of the low concentration impurity regions 1121, 1123 is 10–100 kΩ/square.

Figure 5J:
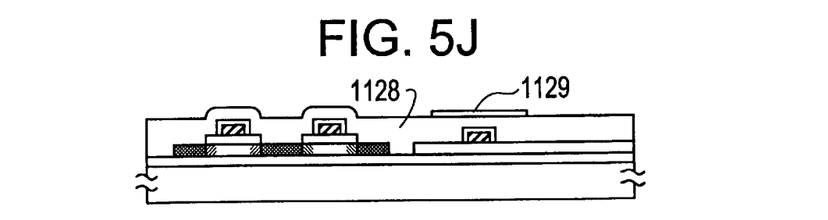

Referring to FIG. 5J, a silicon oxide film or a silicon nitride film or a multi-layer thereof is formed through CVD as an interlayer insulating film 1128 to a thickness of 2000 Å to 1 μm, for example, 3000 Å. This insulating film, in turn, becomes a gate insulating film of a reverse staggered type TFT on the active matrix region of the substrate. The use of a silicon nitride film for the interlayer insulating film is advantageous in that hydrogen does not effuse from the active region of the TFTs in the peripheral circuit region and it is not necessary to perform a hydrogenation step later. Subsequently, an amorphous silicon film 1129 is deposited on the gate electrode 1107 to a thickness of 200–500 Å in the active matrix region as shown in FIG. 5J.

Figure 5K:
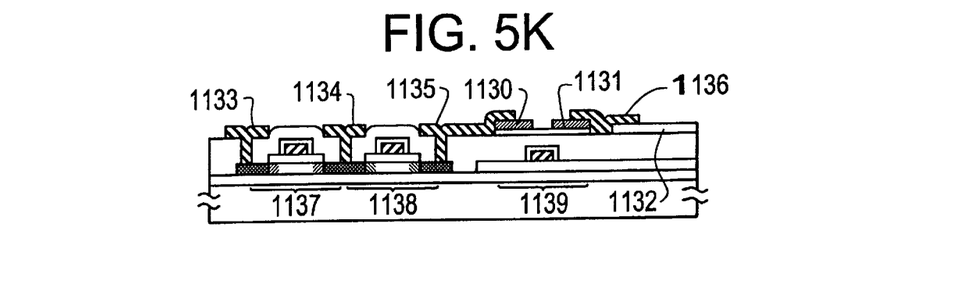

Further, referring to FIG. 5K, a microcrystalline silicon film of an N conductivity type is formed to 500–1000 Å thick on the amorphous silicon film and then patterned into source and drain regions 1130 and 1131. Then, an ITO film is formed by sputtering and patterned in order to form a pixel electrode 1132.

Finally, the interlayer insulating film 128 is etched to form contact holes so that necessary wirings are formed therethrough. For example, electrode/wirings 1133, 1134, 1135, 1136 of a multilayer of titanium nitride and aluminum film having a thickness of 2000 Å–1 μm are formed. Thus, an N-channel type TFT 1137 and a P-channel type TFT 1138 for the peripheral driving circuit and an N-channel type amorphous TFT 1139 for the active matrix circuit are formed on the same substrate.

Because of the use of a semiconductor having a higher crystallinity for the TFTs 1137, 1138 for the peripheral driving circuit and because the sheet resistance of the regions corresponding to source and drain regions is low, the peripheral circuit can be operated at a higher speed. Also, since the TFT 1139 for the active matrix circuit utilizes an amorphous semiconductor, the leak current is lowered and the charge retention capability is improved.

EXAMPLE 4

The present example is directed to a manufacture of an integrated circuit in accordance with the second aspect of the present invention. In FIG. 6F, reference numerals 1232 and 1233 are TFTs for a peripheral driving circuit and reference numeral 1234 is a TFT for an active matrix circuit. The present Example is different from Example 3 in that the TFT in the active matrix region is a top-gate type.

Figure 6A:
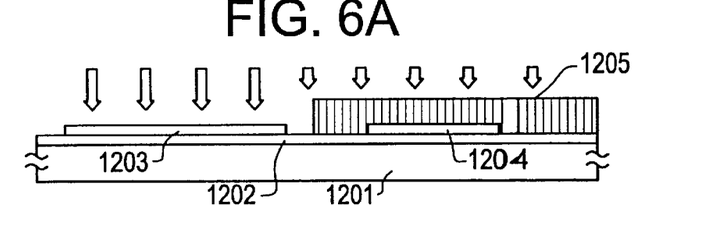
FIGS. 6A–6F are cross sectional views showing a manufacturing method of an insulated gate field effect transistor in accordance with Example 4 of the present invention.

Initially, referring to FIG. 6A, a silicon oxide film 1202 is formed on a substrate 1201, for example, NA35 manufactured by NH Technoglass Co. The thickness of the silicon oxide film 1202 is 1000–3000 Å. On the silicon oxide film, an amorphous silicon film is deposited through plasma CVD or LPCVD to a thickness of 100–1500 Å, preferably, 300–700 Å and then patterned into islands 1203, 1204.

Then, a dehydrogenation of the silicon film is carried out and a mask 1205 is formed on the active matrix region. Then, the silicon island 1203 is crystallized by irradiating a KrF excimer laser (wavelength 248 nm, pulse width 20 nsec). The energy density of the laser is 200–400 mJ/cm$^2$, for example, 250–300 mJ/cm$^2$. Also, it is desirable to heat the substrate at 200–550° C., for example, 400° C. during the laser irradiation in order to improve the crystallinity of the silicon. The silicon region 1204 remains amorphous.

Figure 6B:
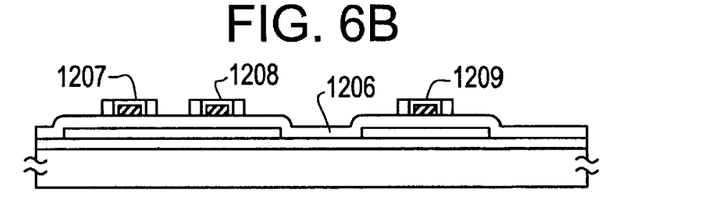

Referring to FIG. 6B, a silicon oxide film 1206 is deposited to a thickness of 800–1500 Å, e.g. 1200 Å by sputtering in an oxygen atmosphere or by plasma CVD using TEOS. Then, an aluminum film of 1000 Å to 3 μm, for example, 6000 Å is formed on the insulating film 1104 by electron beam evaporation or sputtering. The aluminum may contain an appropriate additive, for example, silicon at 1 weight % or scandium (Sc) at 0.1 to 0.3 weight %. Then, in the same manner as in the previous example, gate electrode portions 1207, 1208, 1209 including gate electrodes and barrier type anodic oxide films and porous anodic oxide films are formed. The thickness of the porous anodic oxide films is 0.3 μm and that of the barrier type anodic oxide films is 1200 Å.

Figure 6C:
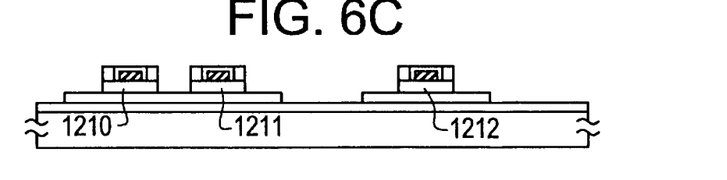

Referring to FIG. 6C, the silicon oxide film 1206 is patterned by a dry etching to form gate insulating films 1210, 1211, 1212. Thereafter, the porous anodic oxide films are removed by etching with an etchant consisting of a mixed acid including phosphoric acid, acetic acid and nitric acid.

Figure 6D:
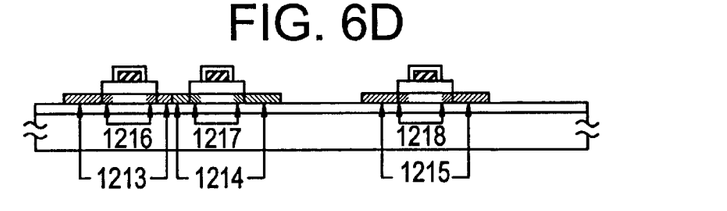

Referring to FIG. 6D, impurity ions (phosphorous and boron) are introduced by ion doping in a self-aligning manner. At this time, the dose amount is reduced in order to suppress a heating of the substrate. Also, the acceleration voltage is increased. For example, the dose is 1×10$^{13}$–5×10$^{13}$ cm$^2$ and the acceleration voltage is 50–90 kV. It is necessary to suppress the heating of the substrate because the silicon film 1204 should remain amorphous. Thus, N type low concentration impurity regions 1216, 1218 and a P-type low concentration impurity region 1217 are formed. The regions 1213, 1214, 1215 which are not covered with the gate insulating film are doped with the impurity at a lower concentration that in the regions 1216, 1217 and 1218.

Figure 6E:
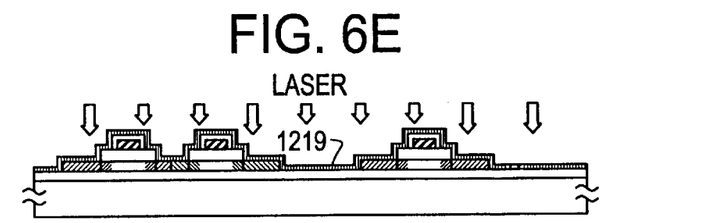
Figure 6F:
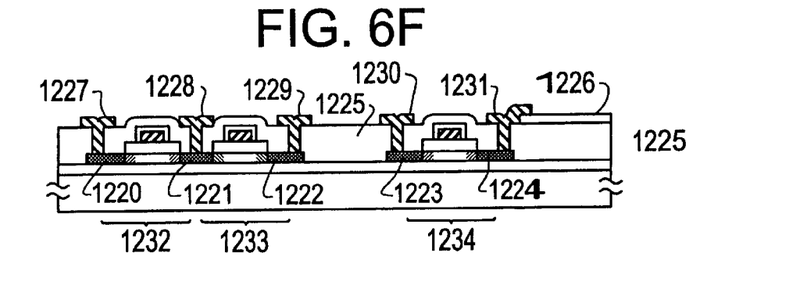

Then, referring to FIG. 6E, a metal 1219 which is capable of forming a silicide in contact with silicon, for example, titanium, nickel, molybdenum, tungsten, platinum or palladium is formed on the entire surface. For example, a titanium film 1219 is formed by sputtering to a thickness of 50–500 Å. Then, in the same manner as in the previous example, titanium silicide regions 1220, 1221, 1222, 1223, 1224 are formed by KrF excimer laser. Since the heating occurring during this step is in a very short time, the silicon 204 can remain amorphous.

Thereafter, the titanium film remaining without converting into a silicide, for example, on the gate electrode or gate insulating film, is etched off by using an etchant containing hydrogen peroxide, ammonium and water at 5:2:2. Further, as shown in FIG. 6F, an interlayer insulating film 1225 is formed on the entire surface through CVD. Either a single layer or multilayer of silicon oxide and silicon oxide may be used as the interlayer insulating film. The thickness of the film is 2000 Å to 1 μm, for example 3000 Å. The substrate should be maintained at a sufficiently low temperature in order to prevent a crystallization of the amorphous silicon film 1204 during the formation of the interlayer insulating film. Thereafter, an ITO (indium tin oxide) film is formed by sputtering and patterned into a pixel electrode 226 of the active matrix region.

Finally, the interlayer insulating film 1225 is etched to form contact holes so that necessary wirings are formed therethrough. For example, electrode/wirings 1227, 1228, 1229, 1230, 1231 of a multilayer of titanium nitride and aluminum film having a thickness of 2000 Å–1 μm are formed. Thus, an N-channel type TFT 1232 and a P-channel type TFT 1233 for the peripheral driving circuit and an N-channel type amorphous TFT 1234 for the active matrix circuit are formed on the same substrate.

In this example, the laser irradiation for the crystallization is performed using a photoresist material. However, it is possible to omit the mask by shaping the laser beam so that it does not extend to the active region. In such a case, it is preferable that the active matrix region and the peripheral circuit region are spaced from each other by 100 μm or more, preferably, 1 mm or more. That is, referring to FIG. 7, the active matrix circuit regions 3 should be distant from the peripheral circuit regions 1 and 2 by more than 100 μm in order to avoid an influence of a laser irradiation performed onto the peripheral circuit regions. It is also possible to locate a metal mask instead of using a photoresist mask in order to simplify the process. Such a mask is not necessary to contact the surface. Also, it is possible to control the depth of a crystallized region in the active layer by controlling the condition of the laser irradiation as disclosed in Japanese patent application No. 3-50793 in order to further reduce a leak current between source and drain regions.

While various examples are explained, it is to be understood that the present invention should not be limited to those specific examples. Various modifications may be made without departing the scope of the appended claims. For example, referring to FIG. 1D, a portion of the insulating film 104 is completely etched off to form a gate insulating film 104'. However, it is possible that the etching is performed in such a manner that the gate insulating film has a thicker portion under the gate electrode and the surrounding anodic oxides and a thinner portion exposed. In such a case, since the semiconductor layer is not exposed, it is possible to prevent the surface from being contaminated. Also, the present invention may be employed to form three dimensional IC in which a semiconductor circuit is stacked on a monocrystalline IC or other ICs. Further, the present invention may be used to form a semiconductor device or circuit on other insulating substrates such as resin or ceramics.

What is claimed is:

1. A semiconductor device comprising:
   a semiconductor region comprising a channel region, a source region, a drain region, and at least one lower impurity concentration region interposed between said channel region and said source or said drain region;
   a gate insulating film on at least said channel region; and
   a gate electrode on said gate insulating film,
   wherein said source and said drain regions comprise metal silicide regions, and
   wherein said lower impurity concentration region is not covered with said metal silicide region.

2. The semiconductor device of claim 1 wherein a sheet resistance of said metal silicide regions is 10–50 Ω/square and a sheet resistance of said lower impurity concentration region is 10–100 kΩ/square.

3. The semiconductor device of claim 1 wherein said metal is one selected from the group consisting of titanium, nickel, molybdenum, tungsten, platinum, and palladium.

4. The semiconductor device of claim 1 wherein said semiconductor region comprises crystalline silicon.

5. The semiconductor device of claim 1 wherein said semiconductor device is an active matrix type liquid crystal display device.

6. A semiconductor integrated circuit comprising:

a semiconductor region comprising a channel region, a source region, a drain region, and at least one lower impurity concentration region interposed between said channel region and said source or said drain region;

a gate insulating film on at least said channel region; and a gate electrode on said gate insulating film, wherein said source and said drain regions comprise metal silicide regions, and wherein said lower impurity concentration region is not covered with said metal silicide region.

7. The semiconductor integrated circuit of claim 6 wherein a sheet resistance of said metal silicide regions is 10–50 Ω/square and a sheet resistance of said lower impurity concentration region is 10–100 kΩ/square.

8. The semiconductor integrated circuit of claim 6 wherein said metal is one selected from the group consisting of titanium, nickel, molybdenum, tungsten, platinum, and palladium.

9. The semiconductor integrated circuit of claim 6 wherein said semiconductor region comprises crystalline silicon.

10. A semiconductor device comprising:

a semiconductor layer on an insulating surface, said semiconductor layer comprising a channel region, a source region, a drain region, and at least one lower impurity concentration region interposed between said channel region and said source or said drain region;

a gate insulating film on at least said channel region; and a gate electrode on said gate insulating film, wherein said source and said drain regions comprise metal slicide regions, and wherein said lower impurity concentration region is not covered with said metal silicide region.

11. The semiconductor device of claim 10 wherein a sheet resistance of said metal silicide regions is 10–50 Ω/square and a sheet resistance of said lower impurity concentration region is 10–100 kΩ/square.

12. The semiconductor device of claim 10 wherein said metal is one selected from the group consisting of titanium, nickel, molybdenum, tungsten, platinum, and palladium.

13. The semiconductor device of claim 10 wherein said semiconductor region comprises crystalline silicon.

14. The semiconductor device of claim 10 wherein said semiconductor device is an active matrix type liquid crystal display device.

15. A semiconductor integrated circuit comprising:

a semiconductor layer on an insulating surface, said semiconductor layer comprising a channel region, a source region, a drain region and at least one lower impurity concentration region interposed between said channel region and said source or said drain region;

a gate insulating film on at least said channel region; and a gate electrode adjacent to said gate insulating film, wherein said source and said drain regions comprise metal silicide regions, and wherein said lower impurity concentration region is not covered with said metal silicide region.

16. The semiconductor integrated circuit of claim 15 wherein a sheet resistance of said metal silicide regions is 10–50/square and a sheet resistance of said lower impurity concentration region is 10–100 k/square.

17. The semiconductor integrated circuit of claim 15 wherein said metal is one selected from the group consisting of titanium, nickel, molybdenum, tungsten, platinum, and palladium.

18. The semiconductor integrated circuit of claim 15 wherein said semiconductor region comprises crystalline silicon.

19. A semiconductor device comprising:

a semiconductor region comprising a channel region, a pair of lower impurity concentration regions between which said channel region extends, and source and drain regions adjacent to said lower impurity concentration regions;

a gate insulating film on at least said channel region; and a gate electrode on said gate insulating film, wherein said source and drain regions comprise metal silicide regions, and wherein said lower impurity concentration regions are not covered with said metal silicide regions.

20. The semiconductor device of claim 19 wherein a sheet resistance of said second impurity regions is 10–50 Ω/square and a sheet resistance of said first impurity regions is 10–100 kΩ/square.

21. The semiconductor device of claim 19 wherein said metal is one selected from the group consisting of titanium, nickel, molybdenum, tungsten, platinum, and palladium.

22. The semiconductor device of claim 19 wherein said semiconductor region comprises crystalline silicon.

23. The semiconductor device of claim 19 wherein said semiconductor device is an active matrix type liquid crystal display device.

24. A semiconductor device comprising:

a semiconductor layer on an insulating surface, said semiconductor layer comprising a channel region, a pair of lower impurity concentration regions between which said channel region extends, and source and drain regions adjacent to said lower impurity concentration regions;

a gate insulating film on at least said channel region; and a gate electrode on said gate insulating film, wherein said source and drain regions comprise metal silicide regions, and wherein said lower impurity concentration regions are not covered with said metal silicide regions.

25. The semiconductor device of claim 24 wherein a sheet resistance of said second impurity regions is 10–50 Ω/square and a sheet resistance of said first impurity regions is 10–100 kΩ/square.

26. The semiconductor device of claim 24 wherein said metal is one selected from the group consisting of titanium, nickel, molybdenum, tungsten, platinum, and palladium.

27. The semiconductor device of claim 24 wherein said semiconductor region comprises crystalline silicon.

28. The semiconductor device of claim 24 wherein said semiconductor device is an active matrix type liquid crystal display device.

29. A semiconductor device comprising:
a semiconductor region comprising a channel region, a source region, a drain region, and at least one lower impurity concentration region interposed between said channel region and said source or drain region;
a gate insulating film on at least said channel region; and
a gate electrode on said gate insulating film, wherein said source and drain regions comprise metal silicide regions, and wherein said lower impurity concentration region is not covered with said metal silicide region, and wherein said lower impurity concentration region is in contact with one of the metal silicide regions.

* * * * *